United States Patent
Zhu

(10) Patent No.: US 6,359,916 B1
(45) Date of Patent: Mar. 19, 2002

(54) COHERENT POPULATION TRAPPING-BASED FREQUENCY STANDARD AND METHOD FOR GENERATING A FREQUENCY STANDARD INCORPORATING A QUANTUM ABSORBER THAT GENERATES THE CPT STATE WITH HIGH FREQUENCY

(75) Inventor: Miao Zhu, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 17 days.

(21) Appl. No.: 09/587,717

(22) Filed: Jun. 5, 2000

(51) Int. Cl.[7] .................................................. H01S 3/13
(52) U.S. Cl. .............................. 372/32; 372/26; 372/28; 372/39
(58) Field of Search ............................... 372/32, 39, 26, 372/28

(56) References Cited

U.S. PATENT DOCUMENTS 6,201,821 B1 * 1/2001 Zhu et al. ...................... 372/32

* cited by examiner

Primary Examiner—Leon Scott, Jr.

(74) Attorney, Agent, or Firm—Ian Hardcastle

(57) ABSTRACT

The frequency standard comprises a quantum absorber, source of incident electr-omagnetic radiation, detector, controller and signal output. The quantum absorber has a transition between a lower quantum state split by hyperfine interaction into two lower sub-state groups of at least one lower sub-state, and an upper quantum split by hyperfine interaction into upper sub-state groups of at least one upper sub-state. None of the upper sub-state groups is a cycling transition sub-state group having at least one allowed electric dipole transition to one lower sub-state group but none to the other. The upper quantum state differs in energy from a first lower sub-state in one of the lower sub-state groups and from a second lower sub-state in the other of the lower sub-state groups by energy differences that correspond to frequencies of $\omega_1$ and $\omega_2$, respectively. The source is arranged to irradiate the quantum absorber with the incident electro-magnetic radiation that includes two main frequency components having frequencies equal to $\omega_1$ and $\omega_2$. The detector generates a detection signal in response to electromagnetic radiation from the quantum absorber. The controller is responsive to the detection signal and controls the source to generate the main frequency components with a frequency difference that obtains an extremum in the detection signal. The extremum indicates that the frequency difference corresponds to an energy difference between the first and second lower sub-states. The signal output provides a frequency standard signal related in frequency to the frequency difference.

20 Claims, 5 Drawing Sheets

COHERENT POPULATION TRAPPING-BASED FREQUENCY STANDARD AND METHOD FOR GENERATING A FREQUENCY STANDARD INCORPORATING A QUANTUM ABSORBER THAT GENERATES THE CPT STATE WITH HIGH FREQUENCY

RELATED DISCLOSURES

This disclosure is related to the following simultaneously-filed disclosures that are incorporated herein by reference:

Coherent Population Trapping-Based Method for Generating a Frequency Standard Having a Reduced Magnitude of Total a.c. Stark Shift of inventors Miao Zhu and Leonard S. Cutler; Ser. No. 09/588,045, Coherent Population Trapping-Based Frequency Standard Having a Reduced Magnitude of Total a.c. Stark Shift of inventors Miao Zhu and Leonard S. Cutler 09/587,719; and Detection Method and Detector for Generating a Detection Signal that Quantifies a Resonant Interaction Between a Quantum Absorber and Incident Electro-Magnetic Radiation of inventors Leonard S. Cutler and Miao Zhu Ser. No. 09/588,032.

FIELD OF THE INVENTION

The invention relates to high-precision frequency standards and, in particular, to atomic frequency standards based on coherent population trapping (CPT).

BACKGROUND OF THE INVENTION

The proliferation of telecommunications based on optical fibers and other high-speed links that employ very high modulation frequencies has led to an increased demand for highly-precise and stable local frequency standards capable of operating outside the standards laboratory. Quartz crystals are the most commonly-used local frequency standard, but in many cases are not sufficiently stable to meet the stability requirements of modern, high-speed communications applications and other similar applications.

To achieve the stability currently required, a frequency standard requires a frequency reference that is substantially independent of external factors such as temperature and magnetic field strength. Also required is a way to couple the frequency reference to an electrical signal that serves as the electrical output of the frequency standard. Potential frequency references include transitions between quantum states in atoms, ions and molecules. However, many such transitions correspond to optical frequencies, which makes the transition difficult to couple to an electrical signal.

Transitions between the levels of certain ions and molecules and between the hyperfine levels of certain atoms have energies that correspond to microwave frequencies in the 1 GHz to 45 GHz range. Electrical signals in this frequency range can be generated, amplified, filtered, detected and otherwise processed using conventional semiconductor circuits.

An early example of a portable frequency standard based on an atomic frequency reference is the model 5060A frequency standard introduced by the Hewlett-Packard Company in 1964. This frequency standard used a transition between two hyperfine levels of the cesium-133 atom as its frequency reference, and had a frequency accuracy of about two parts in $10^{11}$. Current versions of this frequency standard have an accuracy of about five parts in $10^{13}$ and a stability of a few parts in $10^{14}$.

Less accurate but smaller frequency standards have been built that use a transition between the hyperfine states of a suitable quantum absorber as their frequency reference. The quantum absorber is confined in a cell located in a microwave cavity. FIG. 1 is an energy diagram of a simplified quantum absorber. The quantum absorber has a ground state that is split into two groups of sub-states by the hyperfine interaction. At room temperature, all the sub-states in the two groups are approximately equally populated. For convenience, the two groups of sub-states into which the ground state S of the quantum absorber is split by hyperfine interaction will be called the lower ground state $|g_1\rangle$ and the upper ground state $|g_2\rangle$. The upper ground state and the lower ground state are separated by an energy corresponding to an angular frequency $\omega_0$ in the microwave frequency range. References in this disclosure to frequency should be taken to denote angular frequency.

The quantum absorber additionally has an excited state $|e\rangle$ that is also split by hyperfine interaction into groups of sub-states. The energy differences between the groups into which the excited state is split are small, so the excited state will be treated as a single state in this discussion. The excited state is essentially unpopulated at room temperature.

The quantum absorber is illuminated with monochromatic light having a frequency that corresponds to the energy of the transition between one of the ground states and the excited state. The monochromatic light is conventionally generated by a lamp whose output is filtered to remove all but the desired frequency. For example, consider the transition between the lower ground state $|g_1\rangle$ and the excited state $|e\rangle$. These states have energies of $E_{g0}$ and $E_{e0}$, respectively. The transition frequency $\omega_1$ corresponding to the energy of this transition is:

$$\omega_1 = (E_{g0} - E_{e0})/h,$$

where h is Planck's constant divided by $2\pi$.

When the monochromatic light has a frequency $\omega_1$, the quantum absorber can absorb a quantum of the light, which causes the quantum absorber to move from the lower ground state $|g_1\rangle$ to the excited state $|e\rangle$. The quantum absorber shown can return from the excited state to either one of the ground states, emitting a quantum of fluorescent light. When the quantum absorber returns to the lower ground state, the monochromatic light can move it back to the excited state. However, when the quantum absorber returns to the upper ground state $|g_2\rangle$, the monochromatic light is incapable of moving it back to the excited state. Thus, after one or more absorption/emission cycles, absorption of the incident light and emission of fluorescent light cease because the quantum absorber becomes trapped in the upper ground state. Thus, the monochromatic light creates a population imbalance between the ground states.

Feeding microwave energy into the microwave cavity at a frequency corresponding to the energy difference between the two ground states tends to equalize the populations of the ground states. The change of population causes the absorption of the light transmitted through the cell to increase. The increase can be detected and the resulting detection signal can be used to control the microwave frequency to a frequency at which the absorption of the light transmitted through the quantum absorber is a maximum. When this condition is met, the microwave frequency corresponds to, and is determined by, the energy difference between the ground states. The microwave signal, or a signal derived from the microwave signal, is used as the frequency standard.

The energy difference between the ground states is relatively insensitive to external influences such as electric field strength, magnetic field strength, temperature, etc., and corresponds to a frequency that can be handled relatively conveniently by electronic circuits. This makes the energy difference between the ground states a relatively ideal frequency reference for use in a frequency standard.

More recently, frequency standards have been proposed that use as their frequency reference coherent population trapping (CPT) in the ground states of a quantum absorber. For example, a CPT-based frequency standard is described by Normand Cyr, Michel Têtu and Marc Breton in *All-Optical Microwave Frequency Standard: a Proposal*, 42 IEEE TRANS. ON INSTRUMENTATION & MEASUREMENT, 640 (April 1993). The structure of a CPT-based frequency standard can be similar to that of the frequency standard described above, but the CPT-based frequency standard uses a semiconductor laser as its light source, and only includes a microwave cavity if coherent emission, to be described below, is detected. The quantum absorber is illuminated with incident light having two main frequency components. Each of the main frequency components has a frequency that corresponds to the energy of the transition between one of the ground states $|g_1\rangle$ and $|g_2\rangle$ and the excited state $|e\rangle$ of the quantum absorber. The incident light can be generated using two phase-locked lasers or by modulating the frequency of a single laser. In the former case, the frequency difference between the main frequency components is determined by the frequency difference between the lasers. In the latter case, the frequency difference between the main frequency components is determined by the modulation frequency applied to the laser.

Illuminating the quantum absorber with incident light containing only one main frequency component having a frequency $\Omega_1$ corresponding to the energy of the transition between the lower ground state $|g_1\rangle$ and the excited state $|e\rangle$ would result in the absorption of the incident light and the emission of the fluorescent light ceasing after the quantum absorber became trapped in the upper ground state $|g_2\rangle$, as described above. Similarly, illuminating the quantum absorber with incident light containing only one main frequency component having a frequency $\Omega_2$ corresponding to the energy of the transition between the upper ground state $|g_2\rangle$ and the excited state $|e\rangle$ would result in the absorption of the incident light and the emission of the fluorescent light ceasing after the quantum absorber became trapped in the lower ground state $|g_1\rangle$.

Illuminating the quantum absorber with incident light containing both main frequency components whose frequencies $\Omega_1$ and $\Omega_2$ correspond to the energy differences between the lower ground state and the upper ground state, respectively, and the excited state establishes a specific coherence between the ground states, i.e., a condition in which the quantum absorber is in a specific superposition of the ground states. The quantum absorber in this specific superposition of the ground states does not interact with the two main frequency components of the incident light. This leads to the name dark state, or coherent population trapping (CPT) state for the superposition of the ground states. When the quantum absorber is composed of multiple quantum absorber elements, such as multiple atoms, absorption of the incident light by the quantum absorber is minimized when the number of quantum absorber elements in the CPT state reaches a maximum. In this condition, transmission of the incident light through the quantum absorber is maximized and emission of fluorescent light by the quantum absorber is minimized.

The quantum absorber in the CPT state has an oscillating electromagnetic multipole moment at a frequency equal to the frequency difference. The oscillating electromagnetic multipole moment emits an electromagnetic field called coherent emission. When the number of quantum absorber elements in the CPT state reaches a maximum, the coherent emission generated by the quantum absorber is maximized.

Generation of the CPT state is detected by detecting the electromagnetic radiation from the quantum absorber. The electromagnetic radiation from the quantum absorber is any one of the portion of the incident light that remains unabsorbed after passing through the quantum absorber, the fluorescent light generated by the quantum absorber in response to the incident light and the coherent emission generated by the quantum absorber in response to the incident light. The resulting detection signal is fed to a servo system that controls the frequency difference between the main frequency components to one at which the unabsorbed portion of the incident light has a maximum intensity, the fluorescent light generated by the quantum absorber has a minimum intensity or the coherent emission generated by the quantum absorber has a maximum intensity. When the number of quantum absorber elements in the CPT state reaches a maximum, the frequency difference between the main frequency components corresponds to, and is determined by, the energy difference between the ground states.

The accuracy and stability of the frequency standard depends on the precision with which the maximum or the minimum (collectively, the extremum) in the detection signal can be determined. The extremum in the detection signal indicates the corresponding extremum in the intensity of the corresponding one of the unabsorbed portion of the incident light, the fluorescent light and the coherent emission that occurs when the frequency difference between the main frequency components corresponds to the energy difference between the ground states.

The CPT-based frequency standards that have been reported in the literature generate the CPT state using quantum absorber transitions that generate the CPT state with low efficiency. A quantum absorber transition is a specific transition of a specific quantum absorber, for example, the $D_2$ line of rubidium-87 atoms. Generating the CPT state with low efficiency impairs the stability and accuracy of the frequency standards by two main mechanisms. First, the intensity of the electromagnetic radiation from the quantum absorber at the extremum differs from the background level of the electro-magnetic radiation by from about 0.3% to about 1%. The background radiation contributes noise to the detection signal, which reduces the stability with which the small change in the detection signal representing the extremum is detected. This impairs the stability of the frequency standard.

Second, generating the CPT state with low efficiency requires the incident light that illuminates the quantum absorber to have a high intensity to counteract the effects of a relaxation process that removes quantum absorbers from the CPT state. The incident light subjects the quantum absorber to an a.c. Stark shift that changes the energy levels of the ground states of the quantum absorber and, hence, the frequency corresponding to the energy difference between these states. The a.c. Stark shift depends on the intensity of the incident light, so high intensity incident light subjects the energy levels to a large a.c. Stark shift, which impairs the accuracy of the frequency standard. Moreover, variations in the intensity of the incident light cause variations in the a.c. Stark shift, and variations in the energy difference between the ground states, which degrade the stability of the frequency standard.

Frequency standards having an increased accuracy and stability are required to meet the requirements of modern, high-speed communications and other applications. Thus, what is needed is a CPT-based method for generating a frequency standard that generates the CPT state with higher efficiency to improve in the accuracy and stability of the frequency standard.

SUMMARY OF THE INVENTION

The invention provides a method for generating a frequency standard. In the method, a quantum absorber having a transition between a lower quantum state and an upper quantum state is provided. The lower quantum state is split by hyperfine interaction into two lower sub-state groups of at least one lower sub-state. The upper quantum state is split by hyperfine interaction into upper sub-state groups of at least one upper sub-state. None of the upper sub-state groups is a cycling transition sub-state group that has at least one allowed electric dipole transition to one of the lower sub-state groups but no allowed electric dipole transitions to the other of the lower sub-state groups. The upper quantum state differs in energy from a first lower sub-state in one of the lower sub-state groups and from a second lower sub-state in the other of the lower sub-state groups by energy differences that correspond to transition frequencies of $\omega_1$ and $\omega_2$, respectively. Incident electromagnetic radiation including two main frequency components that have frequencies respectively equal to $\omega_1$ and $\omega_2$ is generated. The main frequency components differ in frequency by a frequency difference. The quantum absorber is irradiated with the incident electromagnetic radiation. Electro-magnetic radiation from the quantum absorber is detected to generate a detection signal. The frequency difference is controlled to obtain an extremum in the detection signal. The extremum indicates that the frequency difference corresponds to the energy difference between the first lower sub-state and the second lower sub-state. A frequency standard signal related in frequency to the frequency difference is then provided.

The invention also provides a frequency standard that comprises a quantum absorber, a source of incident electromagnetic radiation, a detector, a frequency difference controller and a frequency standard signal output. The quantum absorber has a transition between a lower quantum state and an upper quantum state. The lower quantum state is split by hyperfine interaction into two lower sub-state groups of at least one lower sub-state. The upper quantum state is split by hyperfine interaction into upper sub-state groups of at least one upper sub-state. None of the upper sub-state groups is a cycling transition sub-state group that has at least one allowed electric dipole transition to one of the lower sub-state groups but no allowed electric dipole transitions to the other of the lower sub-state groups. The upper quantum state differs in energy from a first lower sub-state in one of the lower sub-state groups and from a second lower sub-state in the other of the lower sub-state groups by energy differences that correspond to transition frequencies of $\omega_1$ and $\omega_2$, respectively. The source of incident electromagnetic radiation is arranged to irradiate the quantum absorber. The incident electromagnetic radiation includes two main frequency components that have frequencies respectively equal to $\omega_1$ and $\omega_2$. The detector is arranged to receive electromagnetic radiation from the quantum absorber and generating a detection signal in response to the received electromagnetic radiation. The frequency difference controller operates in response to the detection signal to control the source to generate the main frequency components with a difference in frequency that obtains an extremum in the detection signal. The extremum indicates that the difference in frequency corresponds to an energy difference between the first lower sub-state and the second lower sub-state. The frequency standard signal output provides a frequency standard signal related in frequency to the difference in frequency.

The frequency standard generating method and frequency standard of the invention employ a quantum absorber transition whose upper quantum state has no cycling transition sub-state groups, i.e., sub-state groups that have at least one allowed electric dipole transition to one of the lower sub-state groups but no allowed electric dipole transitions to the other of the lower sub-state groups. Cycling transition sub-state groups in the upper quantum state of a quantum absorber significantly reduce the efficiency with which the CPT state is generated. A quantum absorber transition whose upper quantum state has no cycling transition sub-state groups generates the CPT state with a substantially increased efficiency. Using such a quantum absorber transition in a CPT-based frequency standard increases the accuracy and stability of the CPT-based frequency standard.

DETAILED DESCRIPTION OF THE INVENTION

The coherent population trapping (CPT) state can be established with high efficiency in the simplified quantum absorber transition described above with reference to FIG. 1 because, in this model, transitions from the excited state $|e\rangle$ to both ground states $|g_2\rangle$ and $|g_1\rangle$ are allowed and have an equal transition probability. Real quantum absorbers are substantially more complex than the model, however.

Figure 1:
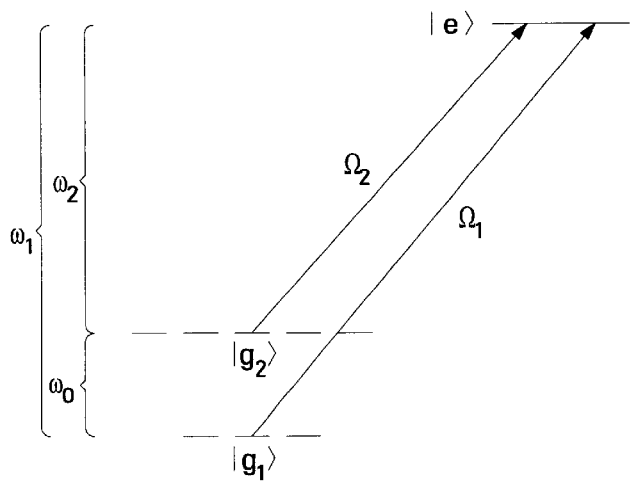
FIG. 1 is an energy diagram showing a simplified quantum absorber transition having only three quantum states.

In particular, in a real quantum absorber having a lower quantum state and an upper quantum state, hyperfine interaction splits both the upper quantum state and the lower quantum state into a number of groups of sub-states. All of the sub-states in a group have the same total angular momentum F. A frequency standard uses a quantum absorber whose lower quantum state is split into two groups of sub-states. In a real quantum absorber, the "ground states" $|g_1\rangle$ and $|g_2\rangle$ shown in FIG. 1 are sub-states in different groups in the lower quantum state.

Also, in real quantum absorbers, transitions between various ones of the sub-states of the upper and lower quantum states are allowed or forbidden in accordance with the rules of quantum mechanics. As a result, many quantum absorber transitions capable of generating the CPT state exist, but only a few of them generate the CPT state with high efficiency. The scientific literature has hitherto failed to identify the quantum absorber transitions that generate the CPT state with high efficiency. Moreover, the scientific literature has consistently taught generating the CPT state using a number of different quantum absorber transitions all of which generate the CPT state with low efficiency. Using the quantum absorber transitions taught by the scientific literature in a CPT-based frequency standard gives rise to the problems described in the background section of this disclosure.

Figure 2:
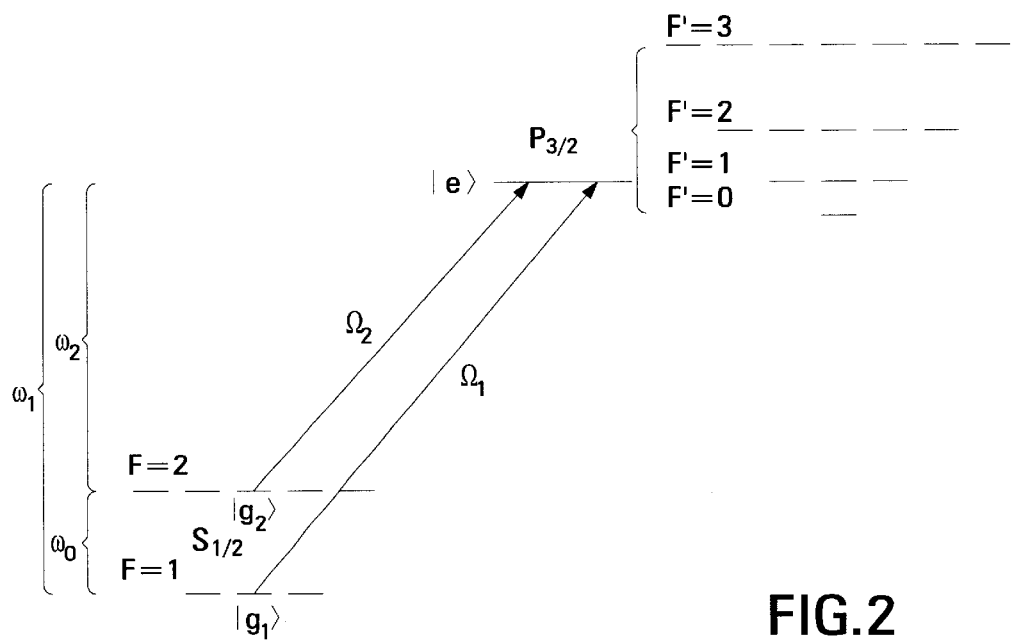
FIG. 2 is an energy diagram showing a quantum absorber transition whose excited state includes cycling transition sub-state groups.

FIG. 2 is an energy diagram showing details of the optical transition known as the $D_2$ line of the alkali metal isotope rubidium-87. The $D_2$ line of rubidium-87 is the quantum absorber transition in which the literature most commonly teaches generating the CPT state. The $D_2$ line of cesium-133 is another quantum absorber transition in which the literature commonly teaches generating the CPT state. In both of these isotopes, the $D_2$ line is the optical transition between the ground state S with a electron angular momentum J of ½, i.e., the $S_{1/2}$ state, and the excited state P with a electron angular momentum of 3/2, i.e., the $P_{3/2}$ state.

FIG. 2 shows the ground state S split by hyperfine interaction into two groups of sub-states each of which include one of the sub-states $|g_1\rangle$ and $|g_2\rangle$. The two groups of sub-states into which the ground state is divided will be called the lower and upper ground sub-state groups. The lower and upper ground sub-state groups are respectively composed of three and five sub-states. Of the sub-states constituting the ground state, the sub-states $|F=I -½, m_F=0\rangle$ and $|F=I+½, m_F=0\rangle$, respectively indicated as the lower and upper ground sub-states $|g_1\rangle$ and $|g_2\rangle$ in FIG. 2, are the sub-states whose energies are least dependent on external magnetic fields and are therefore the preferred ground sub-states for use in frequency standards. In the foregoing, I is the nuclear spin, F is the total angular momentum, i.e., the vector sum of I and J, and $m_F$ is the value of the projection of the total angular momentum F on the quantizing axis.

FIG. 2 also shows the excited state $P_{3/2}$ split by hyperfine interaction into four excited sub-state groups. The sub-states in each of the excited sub-state groups have the same total angular momentum F. The value of F' ranges from 0 through 3, as shown. The relationship between the number x of sub-states in each group and the value of F is defined by x=(2F'+1). Thus, the excited sub-state groups whose sub-states all have a total angular momentum of 0, 1, 2 and 3 are respectively composed of 1, 3, 5 and 7 sub-states.

As noted above, the energy differences between the excited sub-state groups into which the excited state is split by hyperfine interaction are substantially smaller than the energy difference between the sub-states $|g_2\rangle$ and $|g_1\rangle$ in the ground state: the energy difference between the sub-states $|g_2\rangle$ and $|g_1\rangle$ corresponds to a frequency of 6.8 GHz in rubidium-87, whereas the energy difference between the excited sub-state group whose sub-states have a total angular momentum of zero and the excited sub-state group whose sub-states have a total angular momentum of three corresponds to a frequency of about 0.5 GHz.

In a quantum absorber that has a lower quantum state such as the ground state, and an upper quantum state, such as the excited state, and in which hyperfine splitting divides the lower quantum state into two sub-state groups, cycling transition sub-state group is a group of sub-states in the upper quantum state that has at least one allowed electric dipole transition to one sub-state group in the lower quantum state, but has no allowed electric dipole transitions to the other sub-state group in the lower quantum state. For example, in the excited state $P_{3/2}$ of rubidium 87, the excited sub-state group whose sub-state has a total angular momentum F'=0 is a cycling transition sub-state group from which the quantum absorber can only return to the lower ground sub-state group. Moreover, the excited sub-state group whose sub-states all have a total angular momentum F'=3 is a cycling transition sub-state group from which the quantum absorber can only return to the upper ground sub-state group. The cycling transition sub-state groups in the excited state of the $D_2$ line substantially increase the number of photons of the incident light absorbed, and the number of photons of fluorescent light emitted, but do not contribute to generating the CPT state. The allowed transition between a sub-level in a cycling transition sub-state group in an upper quantum state and a sub-state in the sub-state group in a lower quantum state will be called a cycling transition in this disclosure.

The excited states of many other quantum absorber transitions include at least one cycling transition sub-state group, and therefore generate the CPT state with low efficiency. A quantum absorber transition whose excited state includes at least one cycling transition sub-state group reduces the efficiency with which the CPT state is generated and degrades the precision with which generation of the CPT state can be detected by a number of additional mechanisms that include:

1. As noted above, the cycling transition absorbs photons from the incident light, but does not contribute to generating the CPT state since the transition from the cycling transition sub-state group to one of the ground sub-state groups is forbidden. Thus, the existence of one or more cycling transition sub-state groups in the excited state of the transition reduces the number of photons available to generate the CPT state.

2. A quantum absorber in the CPT state can absorb a photon and move to a sub-state in a cycling transition sub-state group. This process removes the quantum absorber from the CPT state.

3. As will be described in further detail below, the frequency of one of the main frequency components is typically controlled, directly or indirectly, by a servo that operates in response to the extremum in the detection signal generated by detecting absorption of the incident light by the quantum absorber or by detecting the fluorescent light generated by the quantum absorber in response to the incident light, as will be described below. The cycling transitions cause the servo to shift the frequency of the main frequency component controlled by the servo such that the main frequency components are de-tuned relative to the respective transition frequencies $\omega_1$ and $\omega_2$ of the optical transitions that generate the CPT state. The frequency mismatch between the main frequency components and their respective transition frequencies reduces the efficiency with which the CPT state is generated.

4. As will be described in further detail below, the difference in frequency between the main frequency components is typically controlled by a servo that operates in response to the above-described extremum in the detection signal. Absorption of the incident light and emission of fluorescent light by the cycling transition decrease the contrast between the maximum intensity of the transmitted light that occurs when the frequency difference is equal to $\omega_0$, the frequency corresponding to the energy difference between the ground sub-states $|g_1\rangle$ and $|g_2\rangle$, and the background intensity of the transmitted light, i.e., the intensity of the transmitted light when the frequency difference is substantially different from $\omega_0$. Similarly, absorption of the incident light and emission of the fluorescent light by the cycling transition decrease the contrast between the minimum intensity of the fluorescent light when the frequency difference is equal to $\omega_0$ and the background intensity of the fluorescent light when the frequency difference is substantially different from $\omega_0$. The reduction in contrast decreases the signal-to-noise ratio of the detection signal.

Another main reason why many quantum absorber transitions generate the CPT state with low efficiency is that the transitions between the excited state and the ground sub-states $|g_1\rangle$ and $|g_2\rangle$ have unequal transition probabilities. To maximize the above-mentioned detection signal, the intensity ratio of the main frequency components should correspond to the transition probabilities. Thus, when the transition probabilities are not equal, the main frequency components should be generated with unequal intensities. This increases the complexity of the light source that illuminates the quantum absorber. Illuminating a quantum absorber having unequal transition probabilities with incident light generated by a simple light source that generates the main frequency components of the incident light with equal intensities reduces the amplitude and, hence, the signal-to-noise ratio of the detection signal.

The inventor has discovered that accuracy and stability of a CPT-based frequency standard can be substantially increased by using a quantum absorber transition (a) whose excited state that has no cycling transition sub-state groups, and (b) that has equal transition probabilities between the excited is state and the sub-states in each of the ground state groups. The $ns^2S_{1/2} \leftrightarrow n'p^2P_{1/2}$ transition of alkali atoms, where n is the lowest principal quantum number, and n'=n (n≠1), n+1, n+2, . . . , has the desired properties. In a preferred embodiment, the so-called $D_1$ line, i.e., the $5s^2S_{1/2} \leftrightarrow 5p^2P_{1/2}$ transition, of rubidium-87 is used as the quantum absorber transition. In an alternative embodiment, the so-called $D_1$ line, i.e., the $6s^2S_{1/2} \leftrightarrow 6p^2P_{1/2}$ transition, of cesium-133 is used as the quantum absorber transition. The $ns^2S_{1/2} \leftrightarrow n'p^2P_{1/2}$ transition of other alkali metal atoms or of hydrogen is also suitable. Moreover, the $ns^2S_{1/2} \leftrightarrow n'p^2P_{1/2}$ transition of alkali-like ions are all suitable. Alkali-like ions are ions having a single electron outside the nucleus or at least one closed shell. All of the suitable quantum absorbers have a single valence electron, and, in all of the suitable quantum absorbers except hydrogen, the single valence electron orbits outside at least one closed shell.

Figure 3:
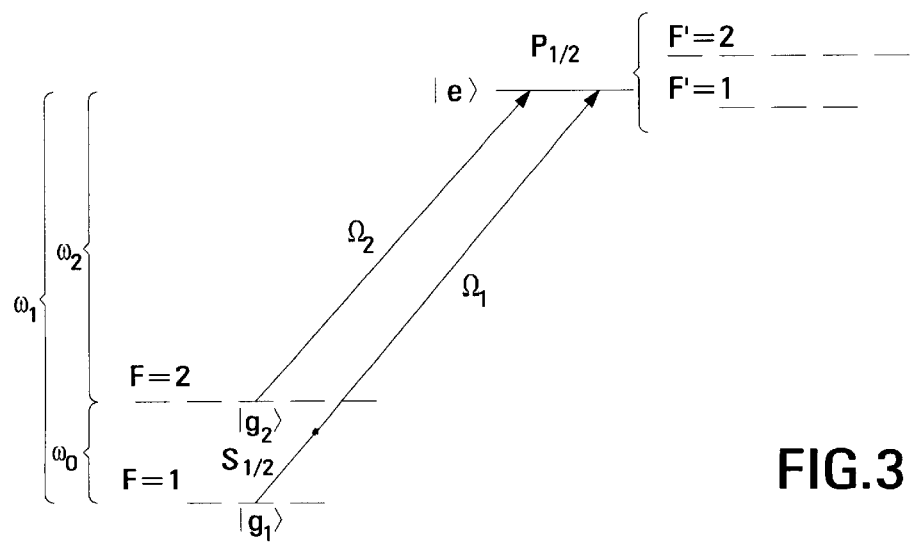
FIG. 3 is an energy diagram showing a quantum absorber transition whose excited state has no cycling transition sub-state groups.

FIG. 3 is an energy diagram showing details of the optical transition known as the $D_1$ line in the alkali metal isotope rubidium-87 as a preferred example of a quantum absorber transition whose excited state that has no cycling transition sub-state groups and that has equal transition probabilities between the excited state and the sub-state in each of the ground state groups.

FIG. 3 shows the ground state S split by hyperfine interaction into the lower and upper ground sub-state groups that respectively include the ground sub-states $|g_1\rangle$ and $|g_2\rangle$. The lower and upper ground sub-state groups are composed of three and five sub-states, respectively. Of the sub-states constituting the ground state, the sub-states $|g_1\rangle = |F=I-½, m_F=0\rangle$ and $|g_2\rangle = |F=I+½, m_F=0\rangle$ are the sub-states whose energies are least dependent on external magnetic fields and are therefore the preferred sub-states of the ground state for use in a frequency standard.

FIG. 3 also shows the excited state $P_{1/2}$ split by hyperfine interaction into two excited sub-state groups. The sub-states in each of the excited sub-state groups have the same total angular momentum F'. The values of F' are one and two, as shown. The excited sub-state groups whose sub-states all have a total angular momentum of 1 and 2 are respectively composed of 3 and 5 sub-states.

Transitions from both of the excited sub-state groups constituting the excited state $P_{1/2}$ to either ground sub-state group are allowed. Consequently, the $D_1$ line of rubidium-87 has an excited state that has no cycling transition sub-state groups. Moreover, the transition probabilities between any of the excited sub-states $|e\rangle = |F'=1, 2; m_{F'}=\pm 1\rangle$ and both ground sub-states $|g_1\rangle$ and $|g_2\rangle$ are equal.

Using a quantum absorber transition having an excited state that has no cycling transition sub-state groups, such as the $ns^2S_{1/2} \leftrightarrow n'p^2P_{1/2}$ transition of alkali metal or hydrogen atoms or of alkali-like ions, as the quantum absorber provides the following advantages in a frequency standard:

The lack of cycling transition sub-state groups eliminates the cycling transition-related absorption and fluorescence.

The mechanism by which a cycling transition would destroy the CPT state does not exist.

Using the extremum in the detection signal to control the frequency of one of the main frequency components causes minimal frequency mis-match between the frequencies of the main frequency components and the transition frequencies $\omega_1$ and $\omega_2$. A close match between the frequencies of the main frequency components and the transition frequencies maximizes the efficiency of generating the CPT state.

The rate at which the detection signal changes in response to an error in the frequency difference between the main frequency components is substantially increased because there is less absorption or fluorescent emission unrelated to the CPT state.

The transition probabilities of the transitions $|F=I-½, m_F=0\rangle \leftrightarrow |F'=I+½, |m_{F'}|=1\rangle$ and $|F=I+½, m_F=0\rangle \leftrightarrow |F'=I+½, |m_{F'}|=1\rangle$ of the $ns^2S_{1/2} \leftrightarrow n'p^2P_{1/2}$ transition of alkali atoms are equal. This is also true when the excited state is $|F'=I-½, |m_{F'}|=1\rangle$. Since the transition probabilities are equal, the efficiency of generating the CPT state is maximized when the intensities of the main frequency components are equal. This enables the main frequency components to be generated simply by modulating the light generated by a single light source, as will be described below with reference to FIGS. 5A and 5B.

Figure 4:
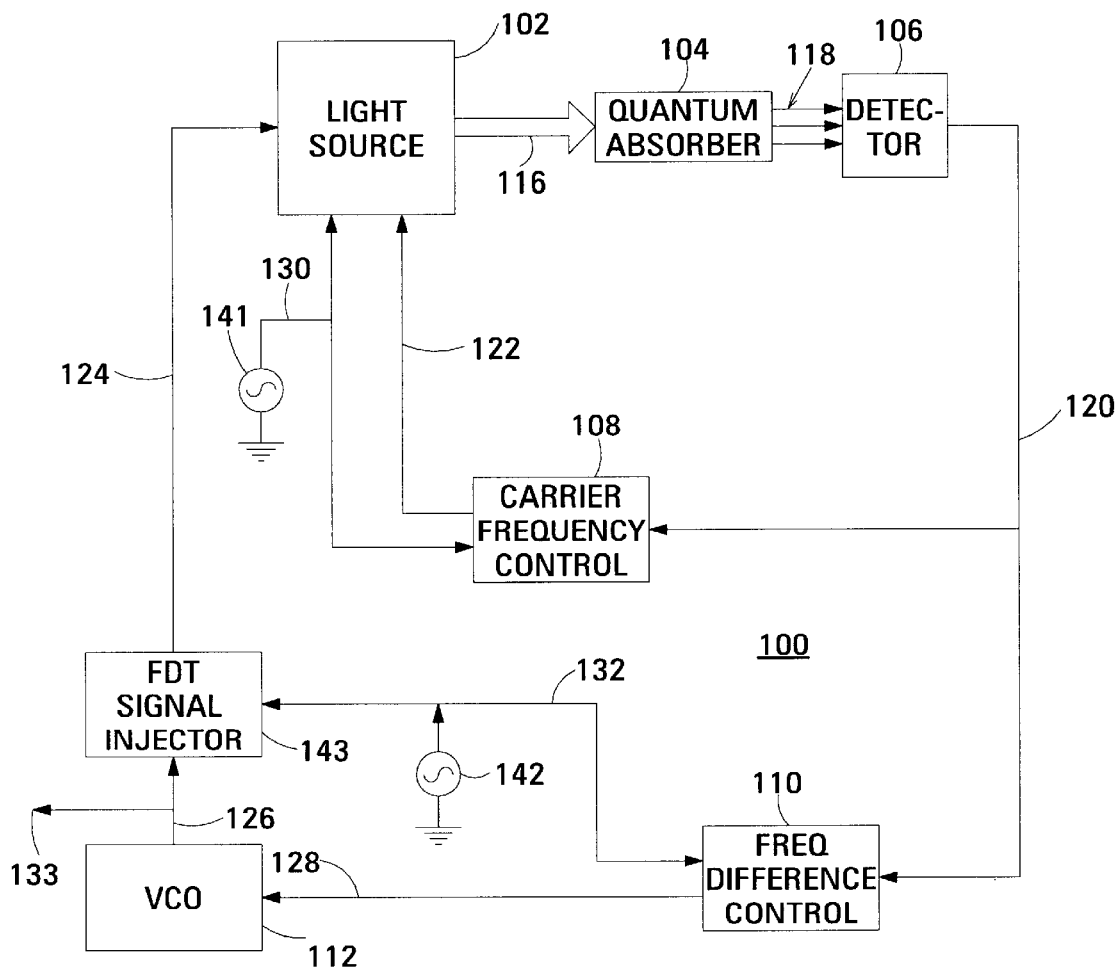
FIG. 4 is a schematic block diagram showing a first embodiment of a CPT-based frequency standard according to the invention.

FIG. 4 is a schematic block diagram showing a first embodiment of a CPT-based frequency standard 100 according to the invention. The frequency standard is composed of the light source 102, the quantum absorber 104, the detector 106, the carrier frequency controller 108, the frequency difference controller 110 and the voltage-controlled oscillator (VCO) 112. The frequency standard additionally includes the oscillators 141 and 142 and the frequency difference tracking signal injector 143.

The light source 102 generates the incident light 116 that illuminates the quantum absorber 104. The detector 106 is located to detect electromagnetic radiation from the quantum absorber and generate a detection signal in response to the electromagnetic radiation. The electromagnetic radiation detected by the detector may be any one of the unabsorbed portion of the incident light transmitted through the quantum absorber, the fluorescent light generated by the quantum absorber in response to the incident light and the coherent emission generated by the quantum absorber in response to the incident light. The detection signal 120 generated by the detector is fed to the carrier frequency controller 108 and the frequency difference detector 110.

The incident light 116 generated by the light source 102 includes two main frequency components having frequencies of $\Omega_1$ and $\Omega_2$. The frequencies $\Omega_1$ and $\Omega_2$ of the main frequency components are equal to the transition frequencies $\omega_1$ and $\omega_2$, respectively, of the quantum absorber transition. A main frequency component having a frequency that differs from a transition frequency by less than about three times the transition line width will be regarded in this disclosure as having a frequency equal to the transition frequency.

In the embodiment shown, the light source 102 is composed of a single source of light, and the light generated by the source of light is modulated in response to the modulation drive signal 124 to generate the incident light 116 with the above-mentioned main frequency components. Examples of the structure of the light source will be described in more detail below with reference to FIGS. 5A and 5B.

The carrier frequency $\Omega_C$ of the incident light 116 generated by the light source 102 is controlled by the carrier frequency controller 108, which will be described below, and is modulated by the modulation drive signal 124 generated by the frequency difference tracking signal injector 143. The frequency of the modulation drive signal 124 is defined by the modulation clock signal 126 generated by the VCO 112. The frequency $\Omega_M$ of the modulation clock signal is preferably set to a frequency equal to $\omega_0/2$, where $\omega_0 = (\omega_1 - \omega_2)$, by the frequency difference controller 110, as will be described in more detail below. A modulation frequency equal to $\Omega_M$ sets the frequency difference between the main frequency components to $\omega_0$. Alternatively, the frequency $\Omega_M$ may be set to $\omega_0/n$, where n is an integer.

The VCO 112 generates the modulation clock signal 126, which it feeds to the input of the frequency difference tracking signal injector 143 interposed between the VCO and the light source 102. The frequency difference tracking signal injector will be described below. The VCO additionally feeds the modulation clock signal to the output 133. The modulation clock signal fed to the output 133 can be used as a frequency standard signal. Alternatively, conventional phase-locked loop and frequency divider circuits (not shown), or other techniques, can be used to generate from the modulation clock signal 126 a frequency standard signal having a more convenient frequency. Such frequency standard signal has a frequency accuracy and stability defined by the modulation clock signal 126.

As will be described in further detail below, the frequency difference tracking signal injector 143 generates the modulation drive signal 124 from the modulation clock signal 126 and feeds the modulation drive signal to the light source 102. The amplitude of the modulation drive signal determines the modulation of the incident light 116 generated by the light source. The modulation is chosen to generate the incident light with at least the main frequency components described above. The incident light is modulated with a modulation index $\beta$, which is the ratio of the deviation $\Delta\Omega$ of the frequency of the incident light caused by the modulation to the modulation frequency $\Omega_M$, i.e., $\beta = \Delta\Omega/\Omega_M$, and is typically in the range from 1.5 to 3.

Figure 6A:
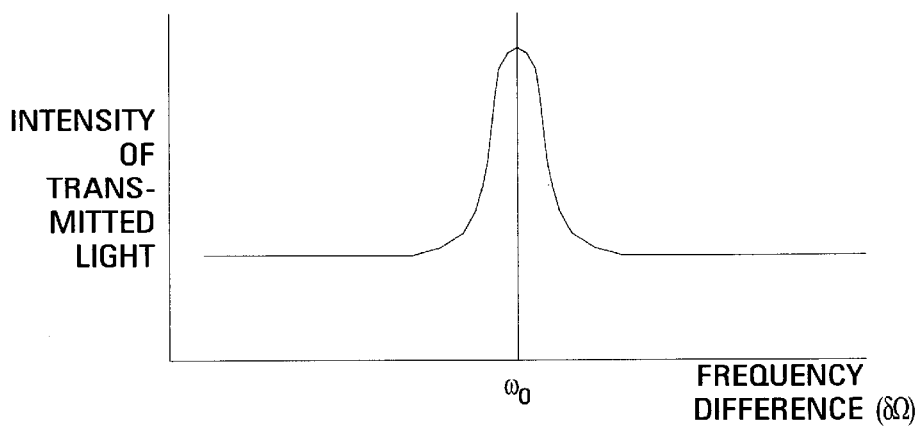
FIGS. 6A, 6B and 6C are graphs showing examples of the variation of the intensities of the transmitted light, fluorescent light and coherent emission, respectively, with the frequency difference $\delta\Omega$ between the main frequency components of the incident light.
Figure 6B:
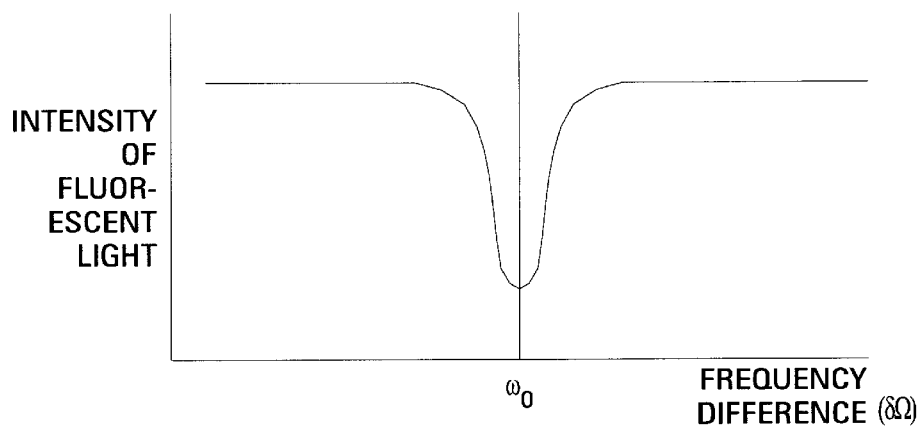
Figure 6C:
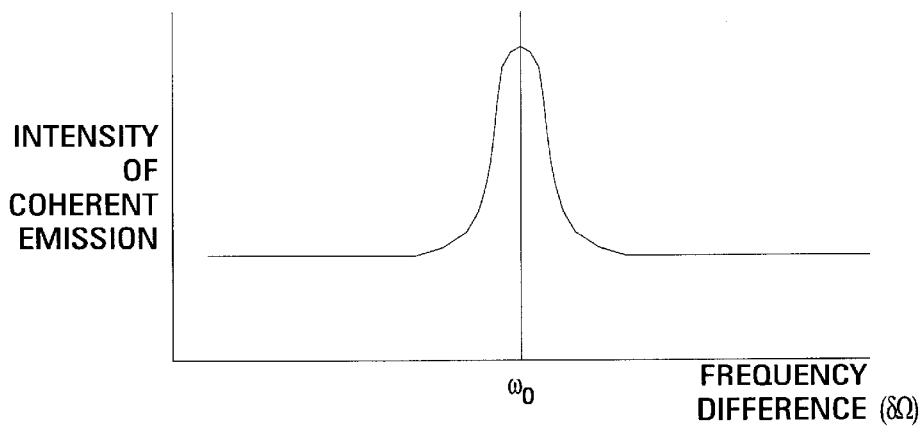

As noted above, the carrier frequency $\Omega_C$ of the incident light 116 generated by the light source 102, i.e., the unmodulated frequency of the incident light, is controlled by the control signal 122 generated by the carrier frequency controller 108. To aid the operation of the carrier frequency controller, the carrier frequency is additionally modulated by the carrier frequency tracking signal 130 generated by the oscillator 141. The frequency of the carrier frequency tracking signal should be greater than the line width of the resonance at the frequency $\omega_0$, as shown in FIGS. 6A, 6B and 6C, to be described below. A typical value is 10 kHz. The oscillator 141 feeds the carrier frequency tracking signal to the light source 102 and also to the carrier frequency controller 108.

FIGS. 6A, 6B and 6C are graphs respectively showing how the intensities of the unabsorbed portion of the incident light transmitted through the quantum absorber (the transmitted light), the fluorescent light generated by the quantum absorber in response to incident light and the coherent radiation generated by the quantum absorber in response to incident light vary when the frequency difference $\delta\Omega$ between the main frequency components differs from the frequency $\omega_0$ corresponding to the energy difference between the ground states. In these Figures, the background level has been reduced to show the shape of the resonance more clearly. When the quantum absorber transition is chosen in accordance with the teaching of this disclosure, the intensity at the extremum corresponding to a frequency difference of zero typically differs from the background intensity by about 5%. Otherwise, the difference is typically in the range from 0.3% to 1%, as noted above.

The carrier frequency controller 108 operates in response to the detection signal 120 and the carrier frequency tracking signal 130 to set the carrier frequency $\Omega_C$ of the incident light 116 generated by the light source 102 to a frequency equal to $(\omega_1+\omega_2)/2$. Modulation of this carrier frequency with a modulation frequency $\Omega_M$ equal to $(\omega_1-\omega_2)/2$, as described above, generates the main frequency components with frequencies $\Omega_1$ and $\Omega_2$ equal to $\omega_1$ and $\omega_2$, respectively. The carrier frequency controller includes a synchronous detector (not shown) that operates in response to the carrier frequency tracking signal to detect variations in the detection signal 120 at the frequency of the carrier frequency tracking signal. The carrier frequency controller generates the control signal 122 from the detected variations. The control signal 122 controls one or more appropriate parameters of the light source 102 to set the carrier frequency $\Omega_C$.

The frequency $\Omega_M$ of the modulation clock signal 126 generated by the VCO 112, and, hence, the modulation frequency of the incident light 116, are set by the control signal 128 generated by the frequency difference controller 110. The frequency $\Omega_M$ is preferably set to $\omega_0/2$, where $\omega_0=(\omega_1-\omega_2)$. To aid the operation of the frequency difference controller, the oscillator 142 generates the frequency difference tracking signal 132. The frequency of the frequency difference tracking signal should be less than or equal to the line width of the resonance at the frequency $\omega_0$, as shown in FIGS. 6A, 6B and 6C. A typical value is 100 Hz. The output of the oscillator 142 is connected to an input of the frequency difference controller and to an input of the frequency difference tracking signal injector 143.

The frequency difference tracking signal injector 143 receives the modulation clock signal 126 from the VCO 112 and the frequency difference tracking signal 132 from the oscillator 142. The frequency difference tracking signal injector modulates the frequency of the modulation clock signal 126 at the frequency of the frequency difference tracking signal to generate the modulation drive signal 124. The frequency difference tracking signal generator additionally sets the amplitude of the modulation drive signal to modulate the incident light at the desired modulation index. The frequency difference tracking signal injector also isolates the frequency standard signal fed to the output 133 from the frequency difference tracking signal to prevent the latter signal from impairing the accuracy and stability of the former signal.

The frequency difference controller 110 includes a synchronous detector (not shown) that operates in response to the frequency difference tracking signal 132 to detect variations in the detection signal 120 at the frequency of the frequency difference tracking signal. The frequency difference controller uses the detected variations to generate the control signal 128 that sets the frequency $\Omega_M$ of the modulation clock signal 126 generated by the VCO 112 to a value preferably equal to $\omega_0/2$.

Figures 5A, 5B:
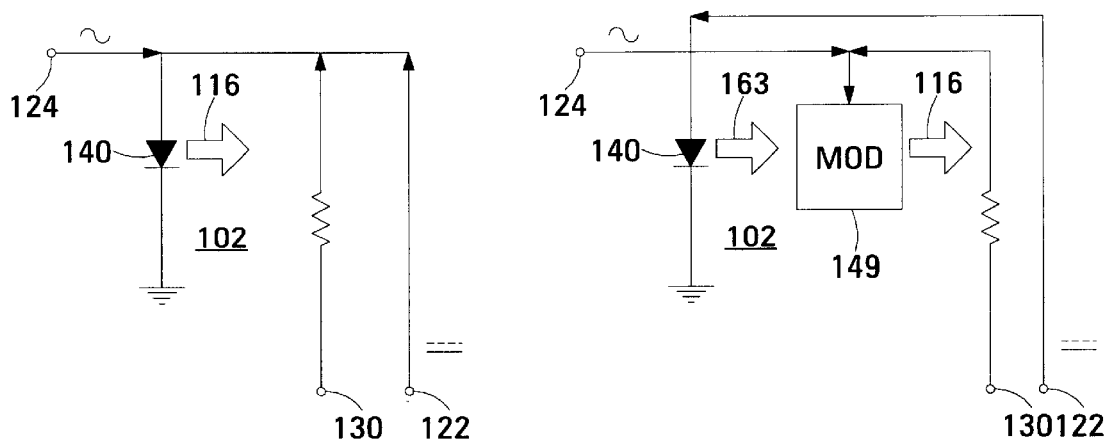
FIG. 5A is a schematic block diagram showing the configuration of a first example of the light source of the frequency standard shown in FIG. 4.
FIG. 5B is a schematic block diagram showing the configuration of a second example of the light source of the frequency standard shown in FIG. 4.

FIG. 5A is a schematic block diagram showing the structure of a first example of the light source 102. In this example, the light source includes the laser 140 that generates the incident light 116. The laser receives the control signal 122 from the carrier frequency controller 108 as its DC drive signal, and additionally receives the modulation drive signal 124 from the frequency difference tracking signal injector 143 and the carrier frequency tracking signal 130 from the oscillator 141.

The frequency of the light generated by a semiconductor laser depends on the drive current through the laser. Consequently, in this embodiment, the DC drive signal 122 determines the frequency $\Omega_C$ of the incident light 116 generated by the laser. The frequency of the incident light is modulated by superimposing the modulation drive signal 124 on the DC drive signal. The frequency of the incident light is additionally modulated by superimposing the carrier frequency tracking signal 130 on the DC drive signal.

FIG. 5B is a schematic block diagram showing the structure of a second example of the light source 102 in which a modulator external to the laser is used to modulate the incident light. In this example, the light source includes the laser 140 and the modulator 149. The laser receives the control signal 122 from the carrier frequency controller 108 as its DC drive signal. The modulator receives the modulation drive signal 124 from the spectrum controller 114, and additionally receives the carrier frequency tracking signal 130 from the oscillator 141. The laser generates the light 163, which is fed to the modulator 149. The modulator modulates at least one of the frequency, amplitude and phase of the light 163 in response to the modulation drive signal and the carrier frequency tracking signal to generate the incident light 116. The carrier frequency tracking signal 130 may alternatively be fed to the laser 140.

The light source 102 may include additional optical elements (not shown) such as lenses, polarizers, wave plates, prisms and optical fibers that further define the characteristics of the incident light 116. For example, a polarizer and a wave plate (not shown) that circularly polarize the incident light may be located between the laser 140 and the quantum absorber 104.

In the preferred embodiment of the frequency standard 100, atoms of rubidium-87 in the vapor state are used as the quantum absorber 104. Atoms of cesium-133 or another alkali metal may alternatively be used. The light source 102 is operated to generate the incident light 116 with a wavelength of 795 nm, which corresponds to the $D_1$ line of rubidium-87. The $D_1$ line of cesium would require the light source to generate the incident light with a wavelength of 895 nm. Alternatively, suitable other atoms, ions or molecules may be used as the quantum absorber, provided that such other atoms, ions or molecules have a quantum absorber transition with the properties set forth above.

In a preferred embodiment of the frequency standard 100 that uses a vapor of rubidium-87 atoms as the quantum absorber 104, the rubidium atoms are confined in a cell (not shown) structured to allow the incident light 116 to illuminate the quantum absorber and to allow any one of the portion of incident light that remains unabsorbed by the quantum absorber, the fluorescent light generated by the quantum absorber in response to the incident light and the coherent emission generated by the quantum absorber in response to the incident light to reach the detector 106. For example, the cell may be cylindrical in shape and made of a transparent material such as, but not limited to, glass, fused quartz or sapphire.

When a cylindrical cell is used, it is located relative to the light source 102 and the detector 106 so that the incident light 116 passes through one end wall of the cell, and the unabsorbed portion of the incident light that is transmitted by the quantum absorber 104, i.e., the transmitted light, leaves the cell through the opposite end wall and impinges on the detector 106. Fluorescent light generated by the quantum absorber in response to the incident light leaves the cell mainly through its curved side walls and is collected by a reflective collector (not shown) that surrounds the cell. The collector concentrates the fluorescent light on the detector 106. When the coherent emission generated by the quantum absorber 104 is detected, the cell may be placed in a microwave resonance cavity (not shown) coupled to the detector 106.

The transmitted light, the fluorescent light and the coherent emission, one of which constitutes the electromagnetic radiation from the quantum absorber 104, have intensities that depend on the frequency difference $\delta\Omega$ between the main frequency components of the incident light 116, as shown in FIGS. 6A, 6B and 6C. These curves assume that the relationship $\{(\Omega_1+\Omega_2)-(\omega_1+\omega_2)\}$ remains fixed. The detection signal 120 generated by the detector 106 in response to the electromagnetic radiation from the quantum absorber has an extremum when the frequency difference $\delta\Omega$ between the frequencies of the main frequency components is equal to the difference $\omega_0$ between the transition frequencies $\omega_1$ and $\omega_2$.

A background slope in the spectral density of the electromagnetic radiation detected by the detector 106 can introduce an error in the frequency at which the extremum in the detection signal 120 occurs. Such error can be reduced by suitable detection methods including detecting the extremum in the detection signal at the frequency of the third harmonic of the frequency difference tracking signal 132. References in this disclosure to the detection signal having an extremum are to be taken to refer to the extremum in the detection signal detected in a way, such as that just described, that reduces any errors caused by a background slope in the spectral density of the detected electro-magnetic radiation.

The working temperature of the cell is stabilized at a suitable temperature. The cell is filled with a vapor of rubidium-87 atoms that act as the quantum absorber 104 and preferably additionally contains solid or liquid rubidium so that the vapor is saturated. In a practical embodiment, the rubidium vapor was maintained at a temperature of about 60° C., with a stability of a few millidegrees C. A lower temperature can be used when cesium atoms are used as the quantum absorber.

The inside surface of the cell can be coated with a hydrocarbon wax. Additionally or alternatively, the cell can contain a buffer gas. These measures reduce interactions of the atoms constituting the quantum absorber with the walls of the cell and with others of the atoms of the quantum absorber and additionally provide a minimally-perturbing confinement of the quantum absorber. Reducing these interactions and providing confinement reduces the width of the resonance at the frequency $\omega_0$ shown in FIGS. 6A, 6B and 6C, and, hence, increases the precision with which the resonance can be detected. One or more noble gasses, nitrogen, a gaseous hydrocarbon such as methane, ethane or propane, or a mixture of such gasses may be used as the buffer gas.

The cell is enclosed in an enclosure of a magnetic shielding material to isolate the quantum absorber from external magnetic fields. A substantially homogeneous magnetic field is applied to the quantum absorber to separate the $m_F=0–m_F=0$ resonance from other resonances and to provide a quantizing axis. In a practical embodiment, the magnetic field strength was typically in the range from 1 to 100 $\mu$T.

When both of the sub-states $|F'=I-\frac{1}{2}, m_{F'}=1\rangle$ and $|F'=I+\frac{1}{2}, m_{F'}=1\rangle$ (or $|F'=I-\frac{1}{2}, m_{F'}=-1\rangle$ and $|F'=I+\frac{1}{2}, m_{F'}=-1\rangle$) of the excited state are used as the excited state for generating the CPT state, the efficiency with which the CPT state can be generated is maximized by generating the incident light 116 to include four main frequency components. The intensities of the four main frequency components should be set according to the states connected by the transitions to maximize the CPT generation efficiency. Incident light including four main frequency components can be generated simply by modulating the light generated by a single laser at two different modulation frequencies. It will be apparent to a person of ordinary skill in the art that the simple light source arrangements shown in FIGS. 5A and 5B, and that to be described below with reference to FIG. 7, can be modified to generate incident light having the increased number of main frequency components.

Figure 7:
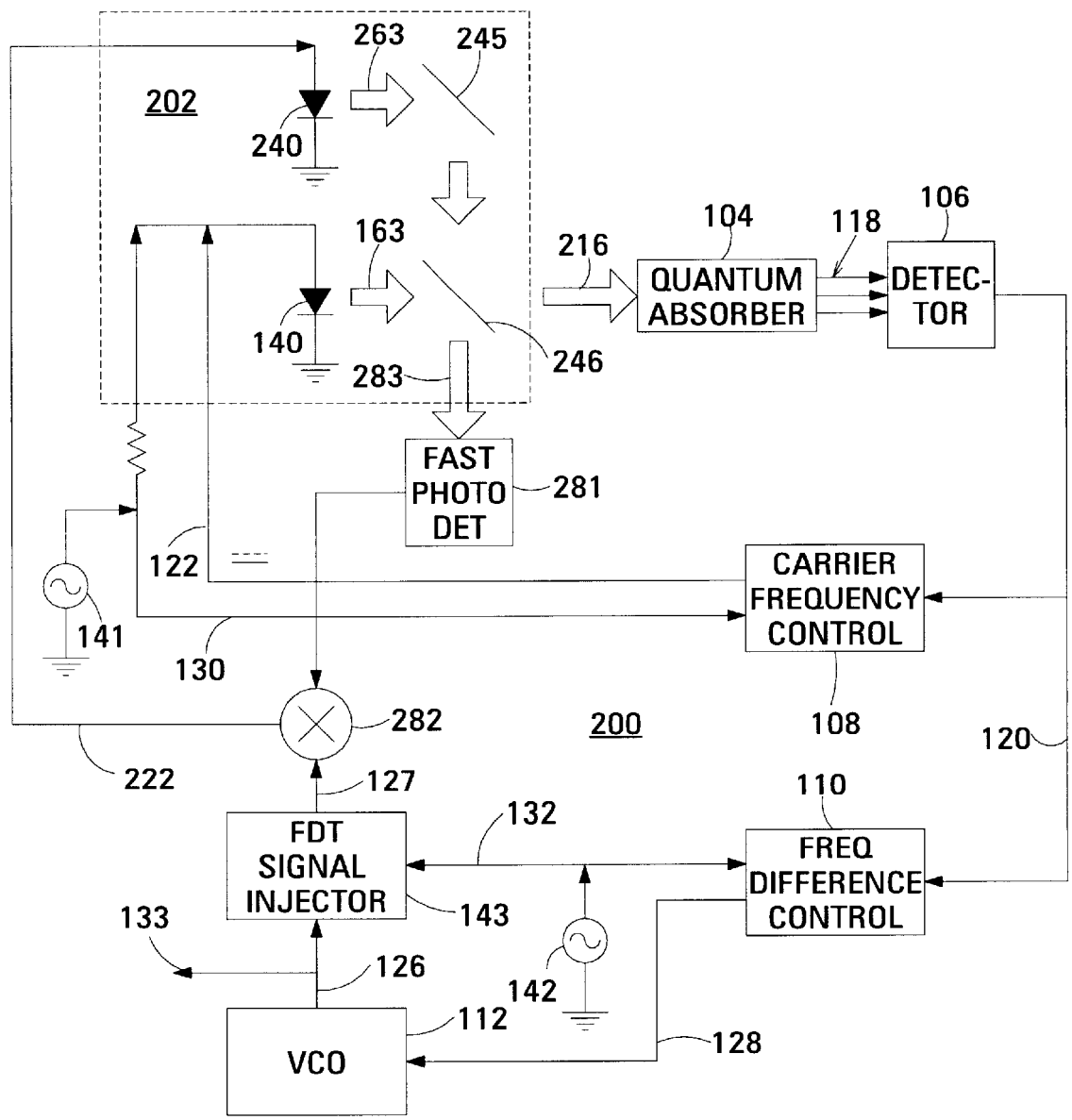
FIG. 7 is a schematic block diagram showing a second embodiment of a CPT-based frequency standard according to the invention in which in which the main frequency components of the incident light are generated by two independent light sources.

FIG. 7 is a schematic block diagram of a second embodiment 200 of a frequency standard according to the invention. In this embodiment, the main frequency components $\Omega_1$ and $\Omega_2$ are generated by different light sources. Elements of the frequency standard 200 that correspond to elements of the frequency standard 100 described above with reference to FIG. 4 are indicated using the same reference numerals, and will not be described in detail here.

In the frequency standard 200, the light source 202 additionally includes the laser 240 and an optical arrangement composed of the reflector 245 and the beam combiner 246. The laser 140 generates the light 163 that includes a main frequency component having a frequency of $\Omega_1$ and the laser 240 generates the light 263 that includes a main frequency component having a frequency of $\Omega_2$. The frequencies of the main frequency components in the light generated by the lasers 140 and 240 may be reversed. The beam combiner spatially overlaps the light 263 with the light 163 to generate the incident light 216 that illuminates the quantum absorber 104. The spatial overlap provided by the beam combiner need only be a partial overlap, but must occur, at least in part, in the quantum absorber. Other optical arrangements or devices, such as optical fibres, may alternatively be used to overlap the light 163 and the light 263.

The frequency standard 200 additionally includes the fast photo detector 281 and the phase/frequency detector 282. The fast photo detector receives a sample 283 of the incident light 216 from the beam combiner 246. The phase/frequency detector 282 has two inputs. One is connected to the output of the fast photo detector and the other is connected to the output of the frequency difference tracking signal injector 143 to receive the modulation clock signal 127. The output of the phase/frequency detector provides the drive signal 222 for the laser 240 in the light source 202.

The frequency of the main frequency component generated by the laser 140 is controlled by the carrier frequency controller 108 in response to the carrier frequency tracking signal 130 to set the frequency of the main frequency component equal to one of the transition frequencies $\omega_1$ and $\omega_2$. The frequency difference controller 110 operates in response to the frequency difference tracking signal 132 to control the frequency of the frequency difference clock signal 126 generated by the VCO 112. The frequency difference clock signal 126 is also fed to the output 133 to provide the frequency reference signal, and is additionally fed to the input of the frequency difference tracking signal injector 143. The frequency difference clock signal 126 determines the frequency of the frequency difference clock signal 127 fed to the phase/frequency detector 282 from the frequency difference tracking signal injector.

The output of the phase/frequency detector 282 sets the drive signal 222 fed to the laser 240 to a level that causes the laser 240 to generate the main frequency component of the light 263 at a frequency that differs by $\omega_0$ from that of the main frequency component of the light 163 generated by the laser 140.

Figure 8:
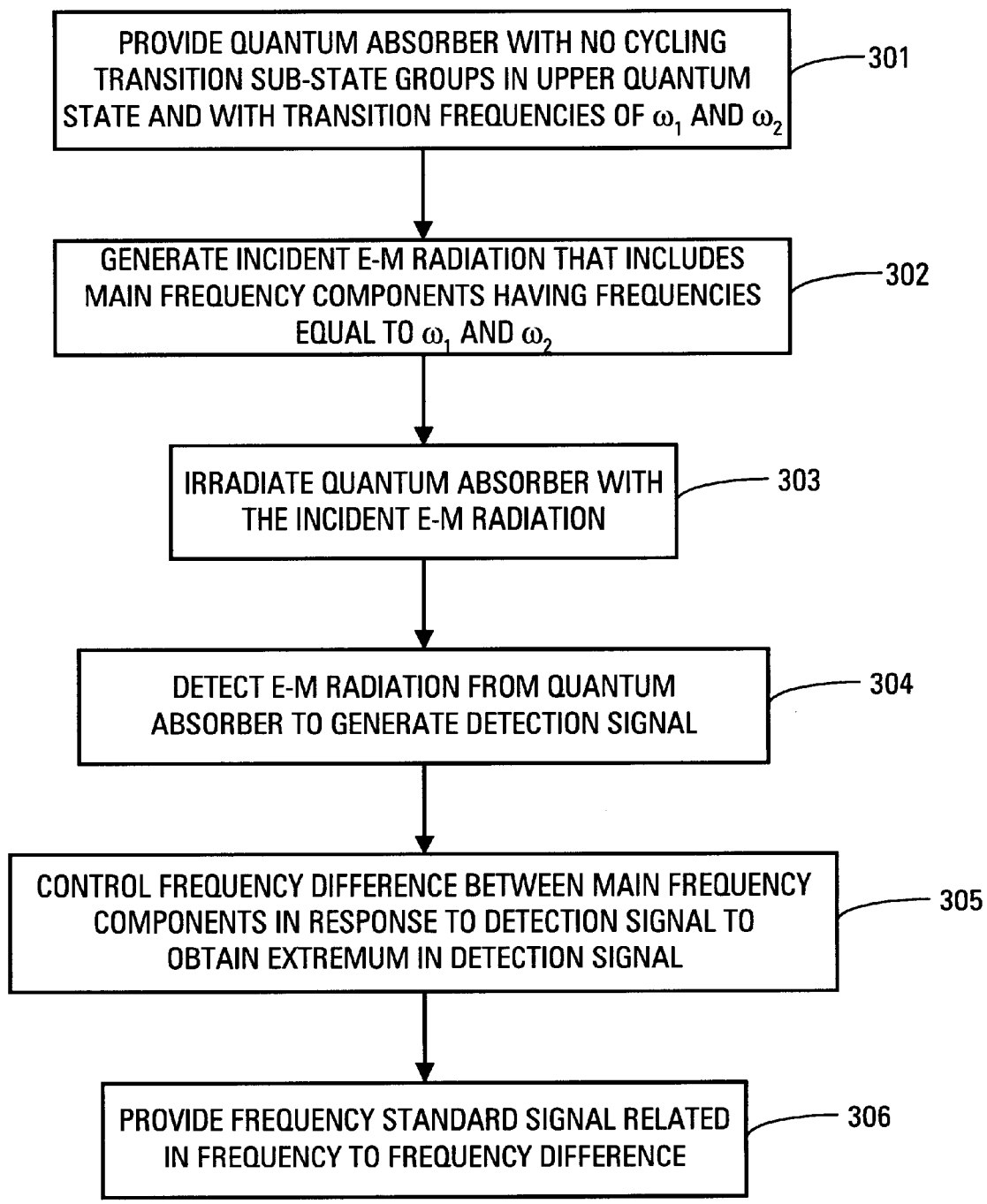
FIG. 8 is a flow chart showing an embodiment of a CPT-based method according to the invention for generating a frequency standard.

FIG. 8 is a flow chart illustrating the method 300 according to the invention for generating a frequency standard.

In process 301, a quantum absorber is provided. The quantum absorber has a transition between a lower quantum state and an upper quantum state. The lower quantum state is split by hyperfine interaction into two lower sub-state groups of at least one lower sub-state. The upper quantum state is split by hyperfine interaction into upper sub-state groups of at least one upper sub-state. None of the upper sub-state groups is a cycling transition sub-state group that has at least one allowed electric dipole transition to one of the lower sub-state groups but no allowed electric dipole transitions to the other of the lower sub-state groups. The upper quantum state differs in energy from a first lower sub-state in one of the lower sub-state groups and from a second lower sub-state in the other of the lower sub-state groups by energy differences that correspond to transition frequencies of $\omega_1$ and $\omega_2$, respectively.

In process 302, incident electromagnetic radiation is generated. The incident electromagnetic radiation includes two main frequency components that have frequencies respectively equal to $\omega_1$ and $\omega_2$, and that differ in frequency by a frequency difference.

In process 303, the quantum absorber is irradiated with the incident electromagnetic radiation.

In process 304, electromagnetic radiation from the quantum absorber is detected to generate a detection signal.

In process 305, the frequency difference is controlled in response to the detection signal to obtain an extremum in the detection signal. The extremum in the detection signal indicates that the frequency difference corresponds to the energy difference between the first lower sub-state and the second lower sub-state.

In process 306, a frequency standard signal related in frequency to the frequency difference is provided.

The various embodiments of the frequency standard according to the invention are described above in terms of a quantum absorber that has transitions with energies that correspond to the electromagnetic radiation commonly known as near infra-red light. It will be apparent to a person of ordinary skill in the art that the embodiments described above can easily be modified to operate with a quantum absorber that has transitions with energies that correspond to electromagnetic radiation in other parts of the spectrum including, but not limited to ultra-violet light, visible light, far infrared radiation and microwave radiation. Suitable generators and detectors for electromagnetic radiation in these parts of the spectrum are known in the art.

Although this disclosure describes illustrative embodiments of the invention in detail, it is to be understood that the invention is not limited to the precise embodiments described, and that various modifications may be practiced within the scope of the invention defined by the appended claims.

I claim:

1. A method for generating a frequency standard, the method comprising:
    providing a quantum absorber that generates a coherent population trapping state with high efficiency and has a transition between a lower quantum state and an upper quantum state, in which:
        the lower quantum state is split by hyperfine interaction into two lower sub-state groups of at least one lower sub-state,
        the upper quantum state is split by hyperfine interaction into upper sub-state groups of at least one upper sub-state,
        none of the upper sub-state groups is a cycling transition sub-state group having at least one allowed electric dipole transition to one of the lower sub-state groups but having no allowed electric dipole transitions to the other of the lower sub-state groups, and
        the upper quantum state differs in energy from a first lower sub-state in one of the lower sub-state groups and from a second lower sub-state in the other of the lower sub-state groups by energy differences that correspond to transition frequencies of $\omega_1$ and $\omega_2$, respectively;
    generating incident electro-magnetic radiation including two main frequency components having frequencies respectively equal to $\omega_1$ and $\omega_2$, and differing in frequency by a frequency difference;
    irradiating the quantum absorber with the incident electromagnetic radiation;
    detecting electro-magnetic radiation from the quantum absorber to generate a detection signal;
    controlling the frequency difference to obtain an extremum in the detection signal, the extremum indicating that the frequency difference corresponds to an energy difference between the first lower sub-state and the second lower sub-state; and
    providing a frequency standard signal related in frequency to the frequency difference.

2. The method of claim 1, in which, in providing the quantum absorber, there is provided a quantum absorber in which:
    the quantum absorber has a single valance electron outside one of (a) a bare nucleus, and (b) at least one closed shell;
    the first lower sub-state and the second lower sub-state are any two lower sub-states of an $ns^2S_{1/2}$ lower quantum state, where n is the principal quantum number; and
    the upper quantum state is an $n'p^2P_{1/2}$ upper quantum state, where $n'=n(n\neq1)$, n+1, n+2, . . .

3. The method of claim 1, in which, in providing the quantum absorber, there is provided a quantum absorber in which:
    the quantum absorber has a single valance electron outside one of (a) a bare nucleus, and (b) at least one closed shell;
    the quantum absorber has a nuclear spin I equal to a half-integer;
    the first lower sub-state and the second lower sub-state are lower sub-states $|F=I-½, m_F=0>$ and $|F=I+½, m_F=0>$ of an $ns^2S_{1/2}$ lower quantum state, where n is a principal quantum number, and I is a nuclear spin; and
    the upper quantum state is an $n'p^2P_{1/2}$ upper quantum state, where $n'=n(n\neq1)$, n+1, n+2, . . .

4. The method of claim 1, in which, in providing the quantum absorber, there is provided a quantum absorber in which:
    the quantum absorber has a single valance electron outside one of (a) a bare nucleus, and (b) at least one closed shell;
    the quantum absorber has a nuclear spin I equal to a half-integer;
    the first lower sub-state and the second lower sub-state are lower sub-states $|F=I-½, m_F=0>$ and $|F=I+½, m_F=0>$ of an $ns^2S_{1/2}$ state, where n is a principal quantum number, and I is a nuclear spin; and
    the upper sub-state groups include an $|F'=I-½, |m_{F'}|=1>$ upper sub-state and an $|F'=I+½, |m_{F'}|=1>$ upper sub-state of an $n'p^2P_{1/2}$ upper quantum state, where $n'=n$ $(n\neq1)$, n+1, n+2, . . .

5. The method of claim 1, in which, in providing a quantum absorber, a vapor of atoms of an alkali element is provided as the quantum absorber.

6. The method of claim 5, additionally comprising confining the vapor of the alkali atoms in a cell.

7. The method of claim 1, in which, in providing a quantum absorber, alkali-like ions are provided as the quantum absorber.

8. The method of claim 1, in which:
    generating the incident electro-magnetic radiation includes:
        generating first electro-magnetic radiation having a first frequency as the first main frequency component,
        generating second electro-magnetic radiation having a second frequency as the second main frequency component, and
        spatially overlapping the first electro-magnetic radiation and the second electro-magnetic radiation to generate the incident electro-magnetic radiation; and
    in controlling the frequency difference, one of the first frequency and the second frequency is controlled.

9. The method of claim 1, in which:
    generating the incident electro-magnetic radiation includes:
        generating electro-magnetic radiation,
        generating a modulation signal having a frequency, and
        modulating the electro-magnetic radiation with the modulation signal to generate the incident electromagnetic radiation; and
    in controlling the frequency difference, the frequency of the modulation signal is controlled to a value equal to the frequency difference divided by an integer.

10. The method of claim 1, in which:
in providing the quantum absorber:
the upper quantum state is a first upper quantum state and is in one of the upper sub-state groups,
the quantum absorber additionally has a second upper quantum state in another of the upper sub-state groups, and
the second upper quantum state differs in energy from the first lower sub-state and from the second lower sub-state by energy differences that correspond to transition frequencies of $\omega_3$ and $\omega_4$, respectively; and
in generating the incident electro-magnetic radiation, the incident electro-magnetic radiation is generated to include two additional main frequency components having frequencies respectively equal to $\omega_3$ and $\omega_4$.

11. A frequency standard, comprising:
a quantum absorber that generates a coherent population trapping state with high efficiency and has a transition between a lower quantum state and an upper quantum state, in which:
the lower quantum state is split by hyperfine interaction into two lower sub-state groups of at least one lower sub-state,
the upper quantum state is split by hyperfine interaction into upper sub-state groups of at least one upper sub-state,
none of the upper sub-state groups is a cycling transition sub-state group having at least one allowed electric dipole transition to one of the lower sub-state groups but having no allowed electric dipole transitions to the other of the lower sub-state groups, and
the upper quantum state differs in energy from a first lower sub-state in one of the lower sub-state groups and from a second lower sub-state in the other of the lower sub-state groups by energy differences that correspond to transition frequencies of $\omega_1$ and $\omega_2$, respectively;
a source of incident electro-magnetic radiation arranged to irradiate the quantum absorber, the incident electro-magnetic radiation including two main frequency components having frequencies respectively equal to $\omega_1$ and $\omega_2$;
a detector arranged to receive electro-magnetic radiation from the quantum absorber and generating a detection signal in response thereto;
a frequency difference controller that operates in response to the detection signal to control the source to generate the main frequency components with a difference in frequency that obtains an extremum in the detection signal, the extremum indicating that the difference in frequency corresponds to an energy difference between the first lower sub-state and the second lower sub-state; and
a frequency standard signal output that provides a frequency standard signal related in frequency to the difference in frequency.

12. The frequency standard of claim 11, in which:
the quantum absorber has a single valance electron outside one of (a) a bare nucleus, and (b) at least one closed shell;
the first lower sub-state and the second lower sub-state are any two lower sub-states in an $ns^2S_{1/2}$ lower quantum state, where n is the principal quantum number; and
the upper quantum state in an $n'p^2P_{1/2}$ upper quantum state, where $n'=n(n\neq1)$, n+1, n+2, . . .

13. The frequency standard of claim 11, in which:
the quantum absorber has a single valance electron outside one of (a) a bare nucleus, and (b) at least one closed shell;
the quantum absorber has a nuclear spin I equal to a half-integer;
the first lower sub-state and the second lower sub-state are lower sub-states $|F=I-\frac{1}{2}, m_F=0>$ and $|F=I+\frac{1}{2}, m_F=0>$ of $ns^2S_{1/2}$ lower quantum state, where n is a principal quantum number, and I is a nuclear spin; and
the upper quantum state is an $n'p^2P_{1/2}$ upper quantum state, where $n'=n(n\neq1)$, n+1, n+2, . . .

14. The frequency standard of claim 11, in which:
the quantum absorber has a single valance electron outside one of (a) a bare nucleus, and (b) at least one closed shell,
the quantum absorber has a nuclear spin I equal to a half-integer;
the first lower sub-state and the second lower sub-state are lower sub-states $|F=I-\frac{1}{2}, m_F=0>$ and $|F=I+\frac{1}{2}, m_F=0>$ of an $ns^2S_{1/2}$ state, where n is a principal quantum number, and I is a nuclear spin; and
the upper sub-state groups include an $|F'=I-\frac{1}{2}, |m_{F'}|=1>$ upper sub-state and an $|F'=I+\frac{1}{2}, |m_{F'}|=1>$ upper sub-state of an $n'p^2P_{1/2}$ upper quantum state, where $n'=n$ $(n\neq1)$, n+1, n+2, . . .

15. The frequency standard of claim 11, in which the quantum absorber includes a vapor of atoms of an alkali element.

16. The frequency standard of claim 15, additionally comprising a cell in which the vapor of the alkali atoms is confined.

17. The frequency standard of claim 11, in which the quantum absorber includes alkali-like ions.

18. The frequency standard of claim 11, in which:
the source of the incident electro-magnetic radiation includes:
a first source that generates first electro-magnetic radiation having a first frequency as the first main frequency component,
a second source that generates second electro-magnetic radiation having a second frequency as the second main frequency component, and
an optical arrangement that spatially overlaps the first electro-magnetic radiation and the second electro-magnetic radiation to generate the incident electro-magnetic radiation; and
the frequency difference controller controls one of the first frequency and the second frequency.

19. The frequency standard of claim 11, in which:
the source of the incident electro-magnetic radiation includes:
an electro-magnetic radiation generator,
a modulation signal generator, the modulation signal having a frequency, and
a modulator that modulates the electro-magnetic radiation with the modulation signal to generate the incident electro-magnetic radiation; and the frequency difference controller controls the frequency of the modulation signal to a value equal to the difference in frequency divided by an integer.

20. The frequency standard of claim 11, in which:

the upper quantum state of the quantum absorber is a first upper quantum state and is in one of the upper sub-state groups;

the quantum absorber additionally has a second upper quantum state in another of the upper sub-state groups;

the second upper quantum state differs in energy from the first lower sub-state and from the second lower sub-state by energy differences that correspond to transition frequencies of $\omega_3$ and $\omega_4$, respectively; and the incident electro-magnetic radiation includes two additional main frequency components having frequencies respectively equal to $\omega_3$ and $\omega_4$.

* * * * *